(12) United States Patent
Ryu et al.

(10) Patent No.: US 6,653,659 B2
(45) Date of Patent: Nov. 25, 2003

(54) SILICON CARBIDE INVERSION CHANNEL MOSFETS

(75) Inventors: Sei-Hyung Ryu, Cary, NC (US); Joseph J. Sumakeris, Apex, NC (US); Anant K. Agarwal, Chapel Hill, NC (US); Ranbir Singh, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/165,400

(22) Filed: Jun. 7, 2002

(65) Prior Publication Data

US 2002/0149022 A1 Oct. 17, 2002

Related U.S. Application Data

(62) Division of application No. 09/615,386, filed on Jul. 13, 2000, now Pat. No. 6,429,041.

(51) Int. Cl.[7] ............................................. H01L 31/0312
(52) U.S. Cl. ........................ 257/77; 257/328; 257/331; 438/268; 438/105
(58) Field of Search ............................ 257/77, 401, 412, 257/613, 744, 328–331, 339, 342, 496, 626, 728; 438/105, 268

(56) References Cited

U.S. PATENT DOCUMENTS

| | | | |
|---|---|---|---|
| 3,629,011 A | | 12/1971 | Tohi et al. .................... 148/1.5 |
| 5,170,231 A | * | 12/1992 | Fujii et al. ................... 257/368 |
| 5,348,895 A | | 9/1994 | Smayling et al. .............. 437/27 |
| 5,384,270 A | * | 1/1995 | Ueno ................. 148/DIG. 148 |
| 5,393,999 A | | 2/1995 | Malhi ........................... 257/289 |
| 5,506,421 A | | 4/1996 | Palmour ........................ 257/77 |
| 5,510,281 A | | 4/1996 | Ghezzo et al. ................. 437/41 |
| 5,710,059 A | | 1/1998 | Rottner ......................... 437/151 |
| 5,734,180 A | * | 3/1998 | Malhi .......................... 257/339 |
| 5,804,483 A | | 9/1998 | Harris .......................... 438/268 |

(List continued on next page.)

FOREIGN PATENT DOCUMENTS

| | | |
|---|---|---|
| DE | 198 09 554 A1 | 9/1998 |
| WO | WO 97/08754 | 3/1997 |
| WO | WO 98/02916 | 1/1998 |

OTHER PUBLICATIONS

Baliga, B.J. "Chapter 7: Power MOSFET," *Power Semiconductor Devices*. 1996, pp. 335–425.

(List continued on next page.)

*Primary Examiner*—Phat X. Cao
*Assistant Examiner*—Thao X. Le
(74) *Attorney, Agent, or Firm*—Myers Bigel Sibley & Sajovec, P.A.

(57) ABSTRACT

Silicon carbide devices and methods of fabricating silicon carbide devices are provided by forming a first p-type silicon carbide epitaxial layer on an n-type silicon carbide substrate. At least one first region of n-type silicon carbide is formed extending through the first p-type silicon carbide epitaxial layer and to the n-type silicon carbide substrate so as to provide at least one channel region in the first p-type silicon carbide epitaxial layer. At least one second region of n-type silicon carbide is also formed adjacent and spaced apart from the first region of n-type silicon carbide. A gate dielectric is formed-over the first region of n-type silicon carbide and at least a portion of the second region of n-type silicon carbide. A gate contact is formed on the gate dielectric. A first contact is also formed so as to contact a portion of the p-type epitaxial layer and the second region of n-type silicon carbide. A second contact is also formed on the substrate. Thus, a silicon carbide power device may be formed without the need for a p-type implant.

12 Claims, 7 Drawing Sheets

U.S. PATENT DOCUMENTS

| | | | | |
|---|---|---|---|---|
| 5,837,572 | A | | 11/1998 | Gardner et al. ............. 438/199 |
| 5,851,908 | A | | 12/1998 | Harris et al. ................ 438/520 |
| 5,877,041 | A | | 3/1999 | Fuller ......................... 438/105 |
| 5,917,203 | A | * | 6/1999 | Bhatnagar et al. .......... 257/133 |
| 5,976,936 | A | * | 11/1999 | Miyajima et al. ........... 438/268 |
| 6,020,600 | A | * | 2/2000 | Miyajima et al. ........... 257/289 |
| 6,025,233 | A | | 2/2000 | Teresawa .................... 438/105 |
| 6,054,352 | A | * | 4/2000 | Ueno ........................... 257/77 |
| 6,107,142 | A | | 8/2000 | Suvorov et al. ............ 438/285 |
| 6,117,735 | A | * | 9/2000 | Ueno ........................... 438/268 |
| 6,133,587 | A | * | 10/2000 | Takeuchi et al. ............ 257/331 |
| 6,165,822 | A | * | 12/2000 | Okuno et al. ................ 438/142 |
| 6,180,958 | B1 | * | 1/2001 | Cooper, Jr. ................. 257/329 |
| 6,221,700 | B1 | | 4/2001 | Okuno et al. ............... 438/518 |
| 6,297,100 | B1 | * | 10/2001 | Kumar et al. ............... 438/105 |
| 6,303,508 | B1 | * | 10/2001 | Alok ........................... 438/305 |

OTHER PUBLICATIONS

Bhatnagar et al. "Comparison of 6H–SiC and Si for Power Devices," IEEE Transactions on Electron Devices. vol. 40, 1993, pp. 645–655.

Palmour et al. "SiC Device Technology: Remaining Issues," Diamond and Related Materials. vol. 6, 1997, pp. 1400–1404.

Rao et al. "P–N Junction Formation in 6H–SiC by Acceptor Implantation into N–Type Substrate," Nuclear Instruments and Methods in Physics Research B. vol. 106, 1995, pp. 333–338.

Rao et al. "Al and N Ion Implantations in 6H–SiC," Silicon Carbide and Related Materials. 1995 Conf, Kyoto, Japan. Published 1996.

Shenoy et al. "High–Voltage Double Implanted Power MOSFET's in 6H–SiC," IEEE Electron Device Letters, vol. 18, No. 3, Mar. 1997, pp. 93–95.

Capano, M.A., et al., Ionization Energies and Electron Mobilities in Phosphorus—and Nitrogen–Implanted 4H–Silicon Carbide, IEEE ICSCRM Conference 1999, Research Triangle Park, North Carolina (Oct. 10–13, 1999).

Vathulya, Vickram R., et al., A Novem 6H–SiC Power DMOSFET with Implanted P–Well Spacer, IEEE Electron Device Letters, vol. 20, No. 7, pp. 354–356 (Jul. 1999).

Patel, R., et al., Phosphorus–Implanted High–Voltage $N^+ P$ 4H–SiC Junction Rectifiers, Proceedings of 1998 International Symposium on Poer Semiconductor Devices & ICs, pp. 387–390 (Kyoto).

Das, Mrinal K., Fundamental Studies of the Silicon Carbide MOS Structure, Thesis (Purdue University, Dec. 1999).

Dastidar, Sujoyita, A Study of P–Type Activation in Silicon Carbide, Thesis (Purdue University, May 1998).

\* cited by examiner

SILICON CARBIDE INVERSION CHANNEL MOSFETS

RELATED APPLICATION INFORMATION

This application is a divisional application of co-pending U.S. application Ser. No. 09/615,386, filed on Jul. 13, 2000, now U.S. Pat. No. 6,429,041 the disclosure of which is incorporated by reference herein in its entirety.

FIELD OF THE INVENTION

This invention relates to methods of fabricating power devices and the resulting devices, and more particularly to silicon carbide power devices and methods of fabricating silicon carbide power devices.

BACKGROUND OF THE INVENTION

Power devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region. An overview of power MOSFETs including DMOSFETs may be found in the textbook entitled "*Power Semiconductor Devices*" by B. J. Baliga, published by PWS Publishing Company, 1996, and specifically in Chapter 7, entitled "*Power MOSFET*", the disclosure of which is hereby incorporated herein by reference.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and with lower specific on-resistance than conventional silicon-based power devices. A theoretical analysis of the superiority of silicon carbide devices over silicon devices is found in a publication by Bhatnagar et al. entitled "*Comparison of 6H—SiC, 3C—SiC and Si for Power Devices*", IEEE Transactions on Electron Devices, Vol. 40, 1993, pp. 645–655. A power MOSFET fabricated in silicon carbide is described in U.S. Pat. No. 5,506,421 to Palmour entitled "*Power MOSFET in Silicon Carbide*" and assigned to the assignee of the present invention.

Notwithstanding these potential advantages, it may be difficult to fabricate power devices including power MOSFETs in silicon carbide. For example, as described above, the double-diffused MOSFET (DMOSFET) is generally fabricated in silicon using a double diffusion process wherein the p-base region is driven in deeper than the n+ source. Unfortunately, in silicon carbide, the diffusion coefficients of conventional p- and n-type dopants are small compared to silicon, so that it may be difficult to obtain the required depths of the p-base and n+ source regions using acceptable diffusion times and temperatures. Ion implantation may also be used to implant the p-base and the n+ source. See, for example, "*High-Voltage Double-Implanted Power MOSFET's in 6H—SiC*" by Shenoy et al., IEEE Electron Device Letters, Vol. 18, No. 3, March 1997, pp. 93–95. However, it may be difficult to control the depth and lateral extent of ion implanted regions. Moreover, the need to form a surface channel surrounding the source region may require the use of two separate implantation masks. It may then be difficult to align the p-base and the source regions to one another, thereby potentially impacting the device performance.

Methods of forming FETs in silicon carbide utilizing p-type implantation have also been described by, for example, commonly assigned U.S. patent application Ser. No. 09/093,207 entitled "*Self-Aligned Method of Fabricating Silicon Carbide Power Devices by Implantation and Lateral Diffusion*," the disclosure of which is incorporated herein by reference as if set forth fully herein. Also, PCT International Publication No. WO98/02916 describes a method for producing a doped p-type channel region layer having on laterally opposite sides thereof doped n-type regions in a silicon carbide layer for producing a voltage-controlled semiconductor device. A masking layer is applied on top of a silicon carbide layer that is lightly n-doped. An aperture is etched in the masking layer extending to the silicon carbide layer. N-type dopants are implanted into an area of the silicon carbide layer defined by the aperture for obtaining a high doping concentration of n-type in the surface-near layer of the silicon carbide layer under the area. P-type dopants having a considerably higher diffusion rate in silicon carbide than the n-type dopants, are implanted into an area of the silicon carbide layer defined by the aperture to such a degree that the doping type of the surface-near layer is maintained. The silicon carbide layer is then heated at such a temperature that the p-type dopants implanted in the surface-near layer diffuse into the surrounding regions of the silicon carbide layer that is lightly n-doped, to such a degree that a channel region layer in which p-type dopants dominates is created laterally to the highly doped n-type surface-near layer and between this layer and lightly n-doped regions of the silicon carbide layer. As described in this International Application, the heating is carried out a temperature above 1650° C. and below 1800°.

As the above illustrates, the difficulties of implantation and diffusion in silicon carbide may make the production of power devices such as the DMOSFET. Accordingly, improvements may be needed in manufacturing processes and device structures of silicon carbide devices such as silicon carbide DMOSFETs.

SUMMARY OF THE INVENTION

In first embodiments, the present invention provides methods of fabricating silicon carbide devices by forming a first p-type silicon carbide epitaxial layer on an n-type silicon carbide substrate. At least one first region of n-type silicon carbide is formed extending through the first p-type silicon carbide epitaxial layer and to the n-type silicon carbide substrate so as to provide at least one channel region in the first p-type silicon carbide epitaxial layer. At least one second region of n-type silicon carbide is also formed adjacent and spaced apart from the first region of n-type silicon carbide. A gate dielectric is formed over the first region of n-type silicon carbide and at least a portion of the second region of n-type silicon carbide. A gate contact is formed on the gate dielectric. A first contact is also formed so as to contact a portion of the p-type epitaxial layer and the second region of n-type silicon carbide. A second contact is also formed on the substrate. Thus, a silicon carbide power device may be formed without the need for a p-type implant.

In particular embodiments of the present invention, the formation of at least one first region of n-type silicon carbide through the first p-type silicon carbide epitaxial layer and to the n-type silicon carbide substrate so as to provide at least one channel region in the first p-type silicon carbide epitaxial layer and at least one second region of n-type silicon carbide which is adjacent and spaced apart from the first region of n-type silicon carbide is carried out by implanting n-type dopants in the p-type silicon carbide epitaxial layer. Furthermore, in an alternative embodiment of the present invention, the formation of at least one first region of n-type silicon carbide through the first p-type silicon carbide epitaxial layer and to the n-type silicon carbide substrate so as to provide at least one channel region in the first p-type silicon carbide epitaxial layer may be preceded by etching a trench in the first p-type silicon carbide epitaxial layer. In such an embodiment, the n-type dopants may be implanted in exposed surfaces of the trench.

Preferably, the implantation of n-type dopants in the p-type silicon carbide epitaxial layer is followed by the activation of the implanted n-type dopants. Such activation may be accomplished by exposing the implanted first p-type epitaxial layer to a temperature of from about 900° C. to about 1400° C. Preferably, the n-type dopant is phosphorous. In such a case, it may be preferred that the activation of the phosphorous be carried out at a temperature of about 1200° C. Such annealing temperatures may activate the implanted ions with less damage to the silicon carbide than higher temperatures.

In other embodiments of the present invention, exposed portions of the first p-type epitaxial layer are capped with a passivating material prior to activating the implanted n-type dopants. In a further embodiment, the gate dielectric may be formed by patterning the passivating material so as to provide the gate dielectric.

In still further embodiments of the present invention, a second p-type silicon carbide epitaxial layer is formed on the p-type silicon carbide epitaxial layer. The second p-type silicon carbide epitaxial layer preferably has a carrier concentration higher than the first p-type silicon carbide epitaxial layer. The second p-type silicon carbide epitaxial layer may then be patterned so as to provide at least one p+ contact region, wherein the at least one p+ contact region is adjacent the at least one second n-type region and wherein the at least one second n-type region is between the at least one p+ contact region and the at least one first n-type region. In a further embodiment, the first contact is formed so as to contact the at least one p+ contact region and the at least one second region of n-type silicon carbide. Thus a high quality contact may be formed without requiring p-type implantation.

In yet other embodiments of the present invention, a voltage absorbing region is formed around the silicon carbide device. In particular embodiments, the voltage absorbing region is formed by etching the first p-type epitaxial layer so as to form at least one step having a sidewall which extends into the first p-type silicon carbide epitaxial layer and wherein the sidewall of the at least one step is spaced apart from the at least one second n-type region. In further embodiments the p-type epitaxial layer is etched to form a plurality of steps. Furthermore, n-type dopants may be implanted in the at least one step of the first p-type epitaxial layer to compensate p-type dopants in the first p-type epitaxial layer. Preferably, the n-type dopants are implanted at a distance from the sidewall of the step based on a desired breakdown voltage of the power device.

In particular embodiments of the present invention, the formation of the gate dielectric comprises forming an oxide layer over exposed portions of the first p-type epitaxial layer and the formation of the first contact comprises etching the oxide layer so as to form a first contact hole and depositing metal in the first contact hole.

In further embodiments of the present invention, a unit cell of a vertical silicon carbide power device includes a first p-type silicon carbide epitaxial layer on an n-type silicon carbide substrate. At least one first region of n-type silicon carbide extends through the first p-type silicon carbide epitaxial layer to the n-type silicon carbide substrate so as to provide a channel region. At least one second region of n-type silicon carbide is adjacent and spaced apart from the first region of n-type silicon carbide. A gate dielectric extends over the first region of n-type silicon carbide and at least a portion of the second region of n-type silicon carbide. A gate contact is formed on the gate dielectric. A first contact contacts a portion of the p-type epitaxial layer and the second region of n-type silicon carbide and a second contact is formed on the substrate.

In further embodiments of the present invention, the first and second regions of n-type silicon carbide are regions of the first p-type epitaxial layer with implanted n-type dopants. In still further embodiments, a trench is formed in the first p-type epitaxial layer and wherein the channel region comprises a region of n-type silicon carbide adjacent sidewalls of the trench.

In still further embodiments, at least one p-type contact region of epitaxial p-type silicon carbide is formed on the first p-type epitaxial layer, wherein the at least one p-type contact region has a carrier concentration higher than the first p-type silicon carbide epitaxial layer so as to provide at least one p+ contact region. The at least one p+ contact region is adjacent the at least one second n-type region and the at least one second n-type region is between the at least one p+ contact region and the at least one first n-type region. In a further embodiment, the first contact contacts the at least one p+ contact region and the at least one second region of n-type silicon carbide.

In still other embodiments, the first p-type epitaxial layer is on an n-type epitaxial layer which is on the n-type substrate, wherein the n-type epitaxial layer has a carrier concentration which is less than that of the n-type substrate.

In other embodiments of the present invention, the first p-type epitaxial layer forms at least one step having a sidewall which extends into the first p-type silicon carbide epitaxial layer and wherein the sidewall of the at least one step is spaced apart from the at least one second n-type region. Furthermore, the first p-type epitaxial may also form a plurality of steps. A compensation region of n-type dopants may also be formed in the at least one step to compensate p-type dopants in the first p-type epitaxial layer. The compensation region may be a distance from the sidewall of the step corresponding to a desired breakdown voltage of the power device.

In still further embodiments of the present invention, a passivating layer is formed on exposed portions of the p+ contact regions and the first p-type epitaxial layer.

DETAILED DESCRIPTION OF PREFERRED EMBODIMENTS

Figure 1:
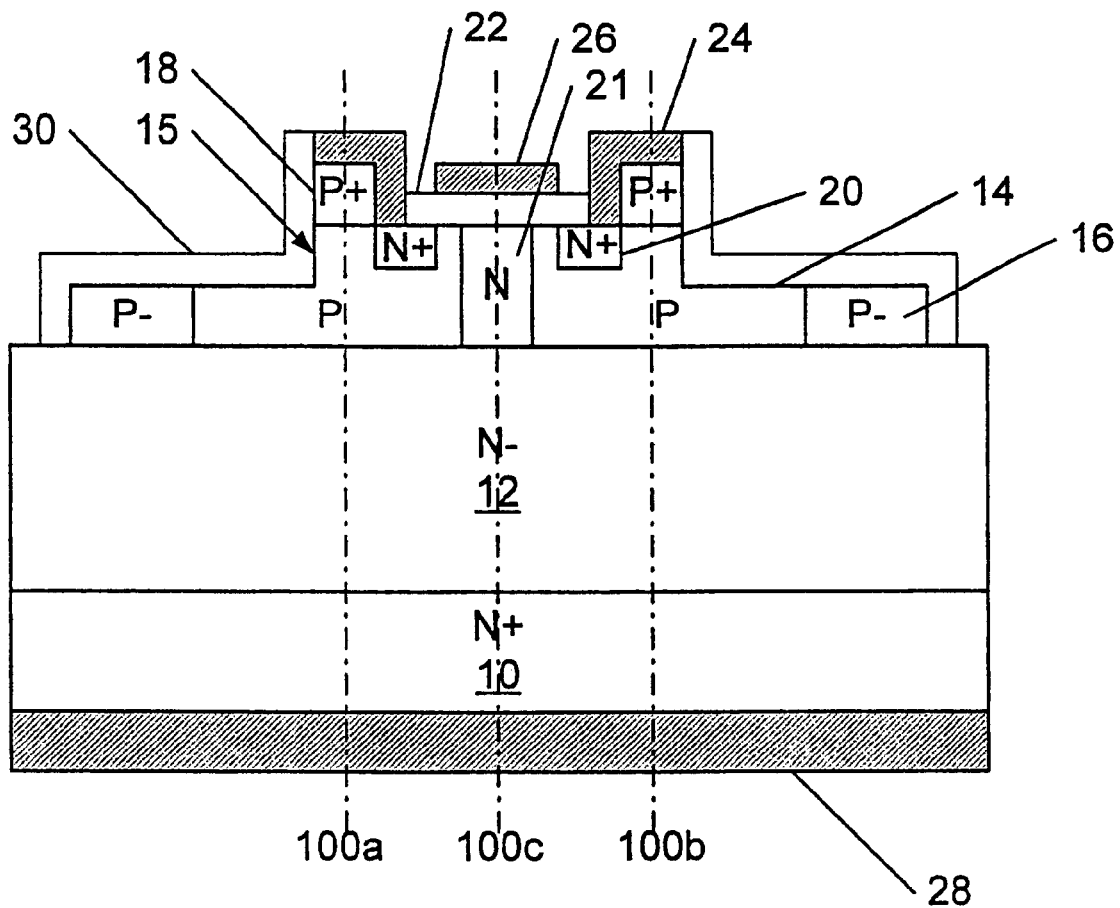
FIG. 1 is a cross-sectional view of embodiments of a power MOSFETs according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

Referring now to FIG. 1, embodiments of a vertical power MOSFET and unit cell of a vertical power MOSFET are illustrated. It will be understood by those having skill in the art that the vertical silicon carbide MOSFETs are generally replicated in a unit cell. Such unit cells are illustrated between lines 100a and 100c or lines 100b and 100c. For ease of illustration, a two unit cell MOSFET will be described, however, as will be appreciated by those of skill in the art, additional unit cells may be incorporated into a MOSFET along one direction or along two, generally orthogonal directions, while still benefiting from the teachings of the present invention.

As is seen in FIG. 1, a MOSFET according to embodiments of the present invention preferably includes an $n^+$ monocrystalline silicon carbide substrate 10. An $n^-$ silicon carbide layer 12 is provided on a first face of the substrate 10. A p-type epitaxially formed silicon carbide p-well region 14 is on the n-type layer 12. A contact region 18 of epitaxially formed $p^+$ silicon carbide may also be provided. Adjacent the contact region 18 is an $n^+$ source region 20 of silicon carbide which is provided in the p-type epitaxial region 14. Adjacent and spaced apart from the $n^+$ source region 20 is an n-type silicon carbide channel region 21 which extends to the $n^-$ layer 12. A gate insulating layer 22 of a suitable dielectric material, such as $SiO_2$, extends over the channel region 21 and to the $n^+$ source regions 20. A gate contact 26 is provided on the gate layer opposite the channel region 21. Source contact 24 is provided between the $p^+$ contact regions 18 and the $n^+$ source regions 20 and drain contact 28 is provided on the face of the substrate 10 opposite the p-type epitaxial region 14.

Also illustrated in FIG. 1 is a voltage absorbing region which may distribute the electric field at the perimeter of the MOSFET so as to reduce field crowding. In particular, the voltage absorbing region may be formed by forming a step or steps in the p-type epitaxial region 14. Such a step may form a mesa having a sidewall 15 which surrounds the device. Furthermore, a $p^-$ region 16 may be formed at the periphery of the device to further distribute the electric field. Formation of such a voltage absorbing region and alternative embodiments of such a voltage absorbing region are described in further detail below. However, the present invention should not be construed as limited to the particular voltage absorbing region configurations illustrated in the figures but may also include variations to such configurations. For example, multiple steps in the p-type epitaxial region 14 may be provided. Similarly, the $p^-$ region 16 may be graded to further distribute the electric field.

Figure 2:
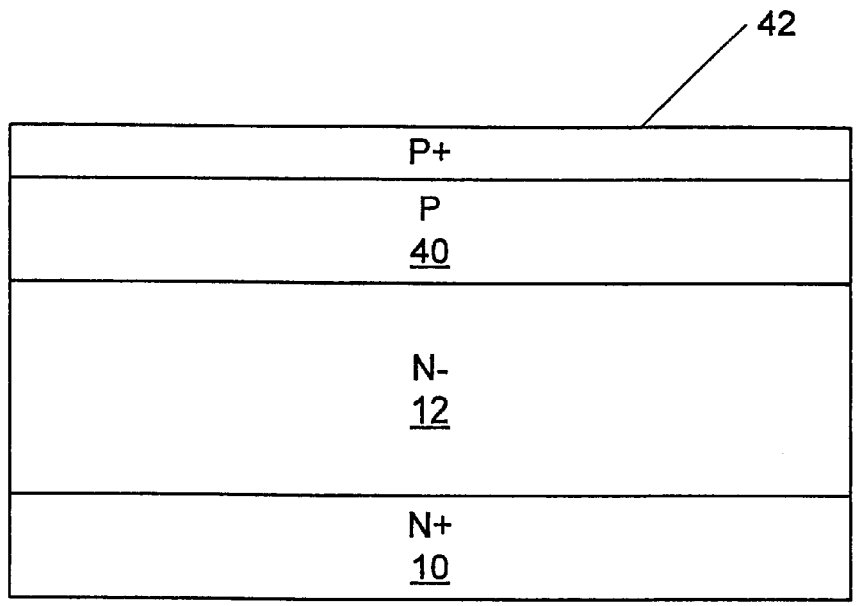
FIGS. 2 through 6 are cross-sectional views illustrating embodiments of methods according to the present invention for producing the power MOSFET of FIG. 1.

Embodiments of the methods of fabrication according to the present invention will now be described. As seen in FIG. 2, an $n^-$ epitaxial layer 12 is formed on an $n^+$ silicon carbide substrate 10. The $n^-$ layer 12 may have a thickness of from about 5 to about 200 $\mu$m and a doping to provide a carrier concentration of from about $1\times10^{14}$ cm$^{-3}$ to about $1\times10^{17}$ cm$^{-3}$. A p-type epitaxial layer 40 is then grown on the $n^-$ epitaxial layer 12. The p-type epitaxial layer 40 may have a thickness of from about 0.5 to about 3 $\mu$m and a doping to provide a carrier concentration of from about $2\times10^{16}$ cm$^{-3}$ to about $5\times10^7$ cm$^{-3}$. If contact regions 18 are utilized, then a second, more highly doped, $p^+$ epitaxial layer 42 may then be grown on the p-type epitaxial layer 14. The $p^+$ epitaxial layer 42 may have a thickness of from about 0.1 to about 1 $\mu$m and a doping to provide a carrier concentration of from about $5\times10^{18}$ cm$^{-3}$ to about $1\times10^{21}$ cm$^{-3}$.

Figure 3:
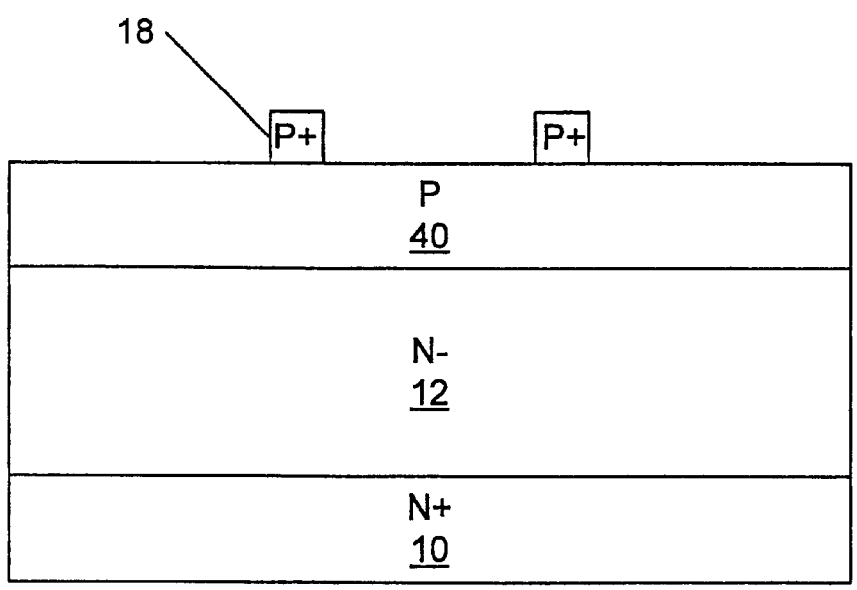

As seen in FIG. 3, the $p^+$ epitaxial layer 42 is then patterned to form the contact regions 18. Such a patterning may be provided by selectively oxidizing or masking and etching the $p^+$ epitaxial layer 42 utilizing techniques suitable for silicon carbide. Patterning techniques are known to those of skill in the art and, therefore, will not be described in detail herein. Alternatively, the contact regions 18 may be formed by masking and selective epitaxial deposition. Preferably, the contact regions 18 have a width of from about 0.1 $\mu$m to about 10 $\mu$m, however, any suitable width which may allow for good ohmic contact formation may be provided. As will be appreciated by those of skill in the art, if the optional contact regions 18 are not utilized, then the patterning operations illustrated in FIG. 3 may be omitted from the fabrication process.

Figure 4:
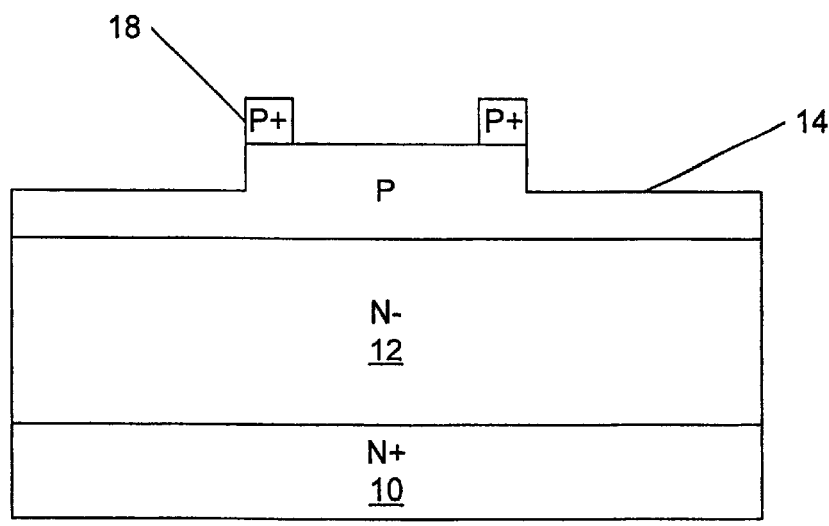
Figure 5:
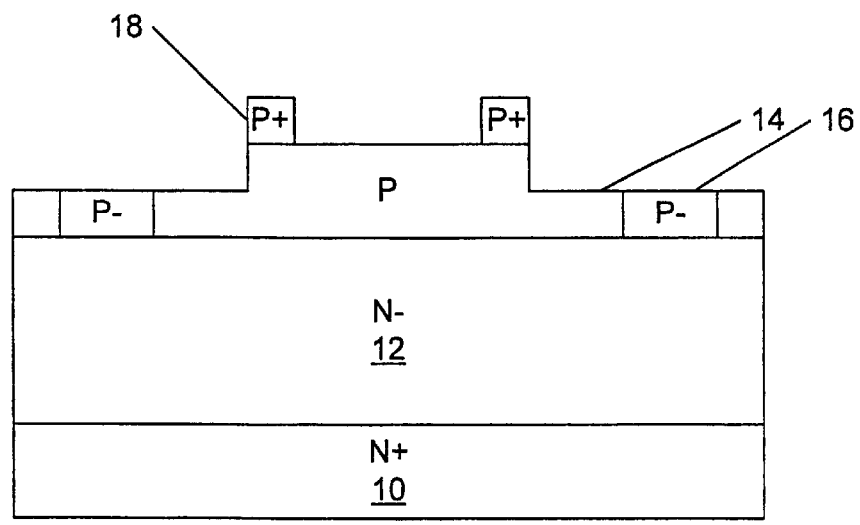

FIGS. 4 and 5 illustrate the formation of a voltage absorbing region. As seen in FIG. 4, the p-type epitaxial layer 14 is etched so as to form a step in the p-type epitaxial layer 14. The voltage absorbing region may have one or more steps so as to gradually reduce the thickness of the p-type epitaxial layer 14. The thickness of the p-type epitaxial layer 14 is preferably reduced so that the product of the thickness and the doping of the carrier concentration of the p-type epitaxial layer 14 is between about $1\times10^{12}$ cm$^{-2}$. As is further seen in FIG. 5, the $p^-$ silicon carbide regions 16 may be formed in the p-type epitaxial layer 16 through, for example, ion implantation techniques known to those of skill in the art. Such implantation may be accomplished by masking and then implanting n-type dopants to compensate a region of the p-type epitaxial layer 14 utilizing techniques known to those of skill in the art. Preferably, the distance between the contact regions 18 and the p⁻ regions 16 is based on the desired breakdown voltage of the device. For example, a distance of about 150 μm may be suitable for a 2 kV device. As will be appreciated by those of skill in the art, other distances may be utilized while benefiting from the teachings of the present invention.

Figure 6:
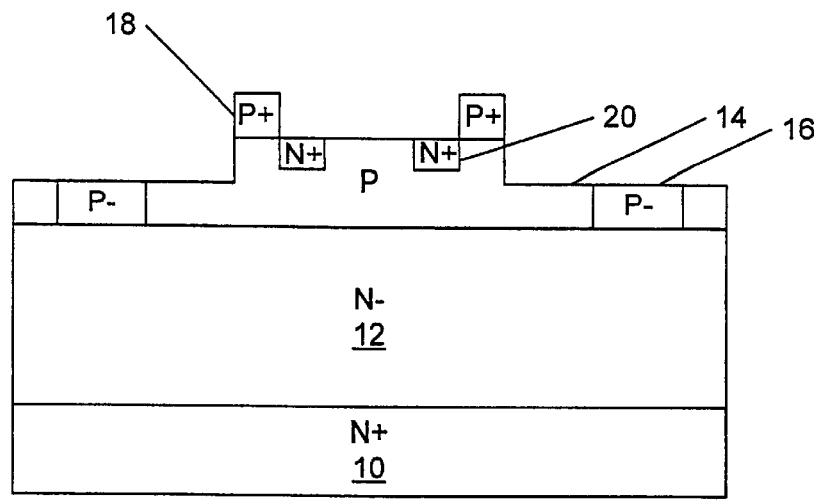

FIG. 6 illustrates the formation of the source regions 20. As seen in FIG. 6, source regions 20 are formed by implanting n-type dopants into the p-type epitaxial layer 14 adjacent the p⁺ contact regions 18 if present. Otherwise, if the contact regions 18 are not utilized, the source regions 20 may be formed by implanting spaced apart regions in the p-type epitaxial layer 14. Preferably, the n-type dopant utilized for all n-type implants is phosphorous, however, nitrogen or other n-type dopants may also be utilized.

Figure 7A:
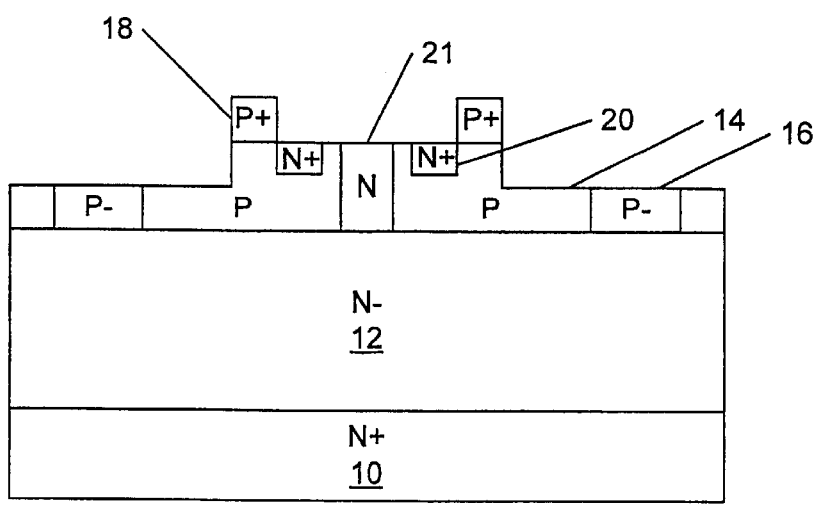
FIG. 7A is a cross-sectional view illustrating methods of fabricating silicon carbide power MOSFETS according to embodiments of the present invention.
Figure 7B:
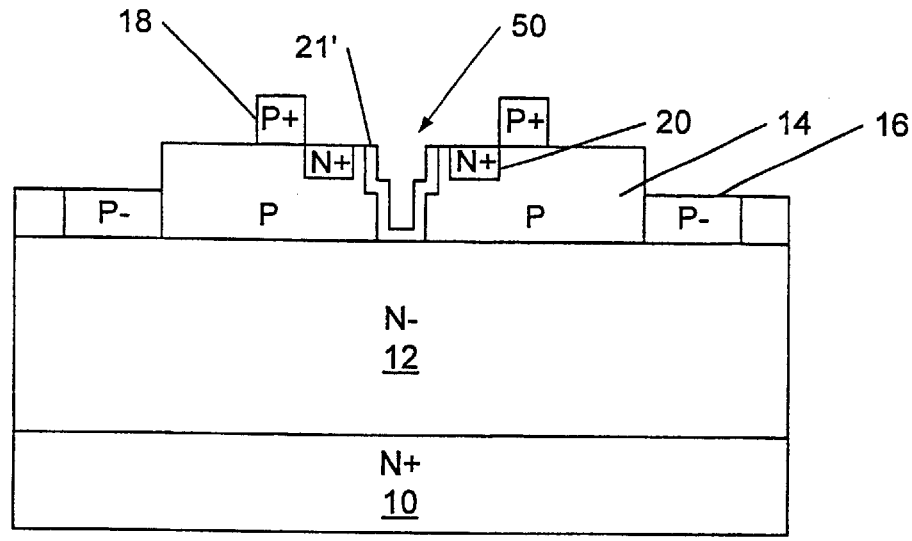
FIG. 7B is a cross-sectional view illustrating methods of fabricating silicon carbide power MOSFETs according to alternative embodiments of the present invention.

FIGS. 7A and 7B illustrate formation of the channel region 21 according to alternative embodiments of the present invention. As seen in FIG. 7A, the channel region 21 may be formed by masking and implanting n-type dopants in the p-type epitaxial layer 14 adjacent but spaced apart from the source regions 20 so as to form the channel region 21 which extends through the p-type epitaxial layer 14 to the n-type epitaxial layer 12. When the device is turned-on, this n-type channel region provides a path from the MOS channel to the lightly doped drift region, allowing electrons to flow from source regions to drain regions. In the off-state, this n-channel region may be depleted of electrons from the reverse biased pn junction, which is formed on both sides of the channel region. The pn-junctions on both sides of the channel region may shield the MOS region from high electric fields at off state, which may result in a higher device reliability compared to trench devices, such as UMOSFETs.

Any suitable n-type dopants may be utilized; however, phosphorous is preferred. The carrier concentration of the n-type channel 21 is preferably from 1 to 200% that of the p-type epitaxial layer 14 and more preferably from 30 to 50% (e.g. from about $1 \times 10^{16}$ cm⁻³ to $2 \times 10^{17}$ cm⁻³). As seen in FIG. 7B, in an alternative embodiment of the present invention, the channel region 21' may also be formed by first etching a trench 50 in the p-type epitaxial layer 14 and then implanting n-type dopants in the exposed portions (the bottom and sidewalls) of the trench 50 so as to provide the channel region 21l. Similar carrier concentrations are preferred for the alternative embodiment illustrated in FIG. 7B as for the embodiment illustrated in FIG. 7A.

The present invention will further be described with reference to FIGS. 8 through 11 which illustrate fabrication operations for the embodiment illustrated in FIG. 7A. As will be appreciated by those of skill in the art, these fabrication operations may be carried out on the embodiment of the present invention illustrated in FIG. 7B with corresponding changes to, for example, formation of the gate dielectric layer and gate contact so as to accommodate the different structure of the channel region 21'. Thus, operations according to the present invention are illustrated with reference to channel region 21 of FIG. 7A, and, corresponding operations performed for devices having the channel region 21' illustrated in FIG. 7B need not be described in detail as such operations will be apparent to those of skill in the art in light of the present discussion.

Figure 8:
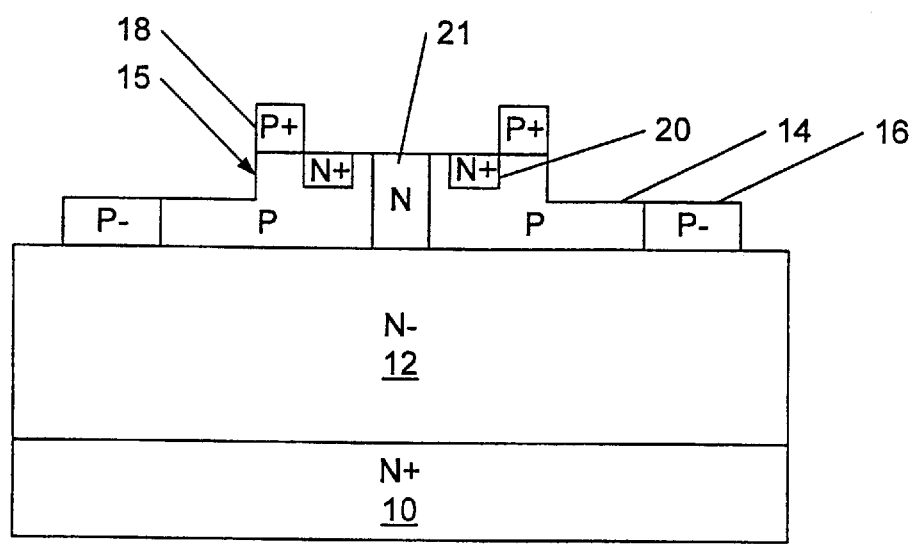
FIGS. 8–11 are cross-sectional views of embodiments of methods of fabricating silicon carbide power MOSFETs according to the present invention.

As seen in FIG. 8, the voltage absorbing region may be etched to isolate the device. Such an etching process may etch through the p-type epitaxial layer 14 to the n-type epitaxial layer 12 so as to form a mesa having a sidewall which extends to and/or into the n-type epitaxial layer 12. Alternatively, the sidewall of the mesa could extend through the n-type epitaxial layer 12 and to and/or into the substrate 10. Preferably, the sidewall of the mesa extends through the p⁻ region 16 at a distance from the source contact region 18 based upon the desired breakdown voltage of the device as described above. Alternatively, the voltage absorbing region may be formed by masking and selective epitaxial growth of the epitaxial layer 40. In such an embodiment of the present invention, the formation of the structure of FIG. 2 would be modified to incorporate the selective epitaxial growth process.

Figure 9:
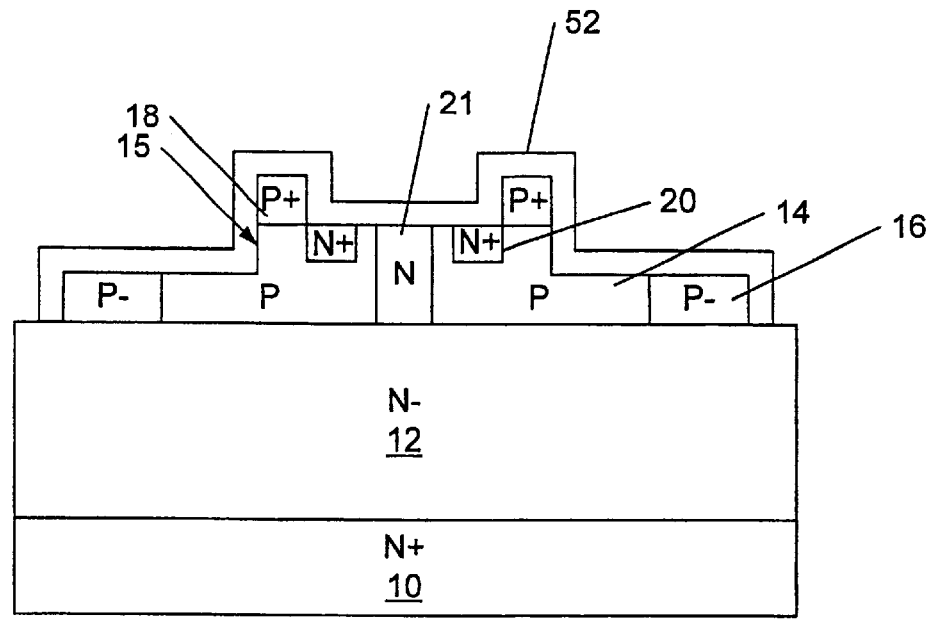

FIG. 9 illustrates formation of an optional cap layer 52 of a deposited oxide and/or other passivating material. The cap layer 52 may have a thickness of from about 0.01 μm to about 1 μm. In any event, whether a cap layer 52 is utilized or not, the device is preferably exposed to a high temperature anneal ranging from about 900° C. to about 1500° C. and preferably less than about 1400° C. and more preferably less than about 1300° C. for several minutes so as to activate the n-type implants. For example, if nitrogen is utilized as the n-type dopant, then an anneal at about 1300° C. for about 3 hours may be utilized. If phosphorous is utilized as the n-type dopant, then an anneal at about 1200° C. for about 3 hours may be utilized.

Figure 10:
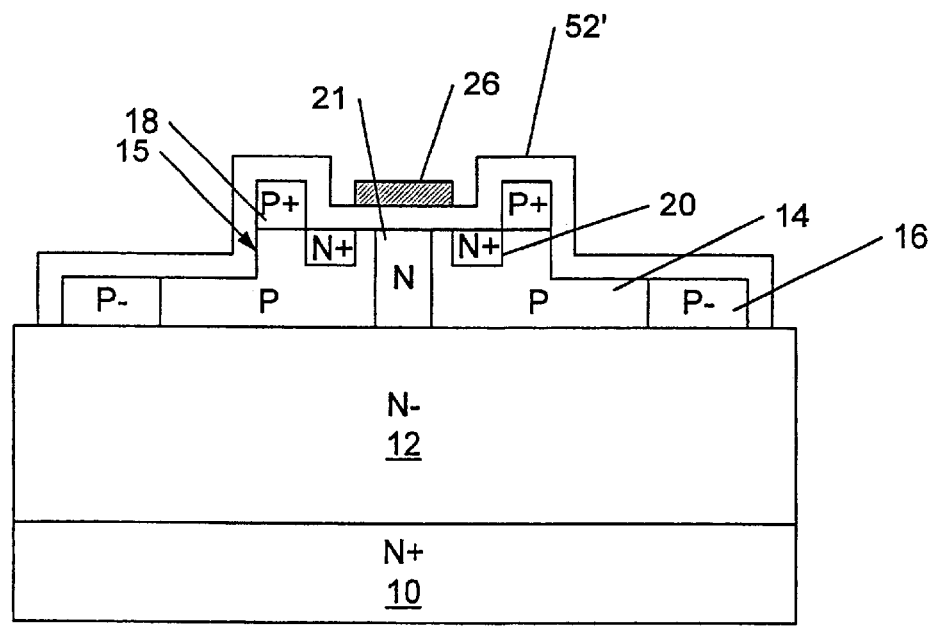

As illustrated in FIG. 10, after the anneal, the cap layer 52 may be stripped off of the device and a layer 52' of dielectric material deposited on the device so as to provide a gate dielectric material. Alternatively, the cap layer 52 may be used as the gate dielectric material. In either case, a gate contact 26 may be formed by forming a metal contact on the gate dielectric material. Suitable gate contact materials include, but not limited to, aluminum, polysilicon and molybdenum. Furthermore, as will be appreciated by those of skill in the art, a multi-layered gate contact may also be utilized.

Figure 11:
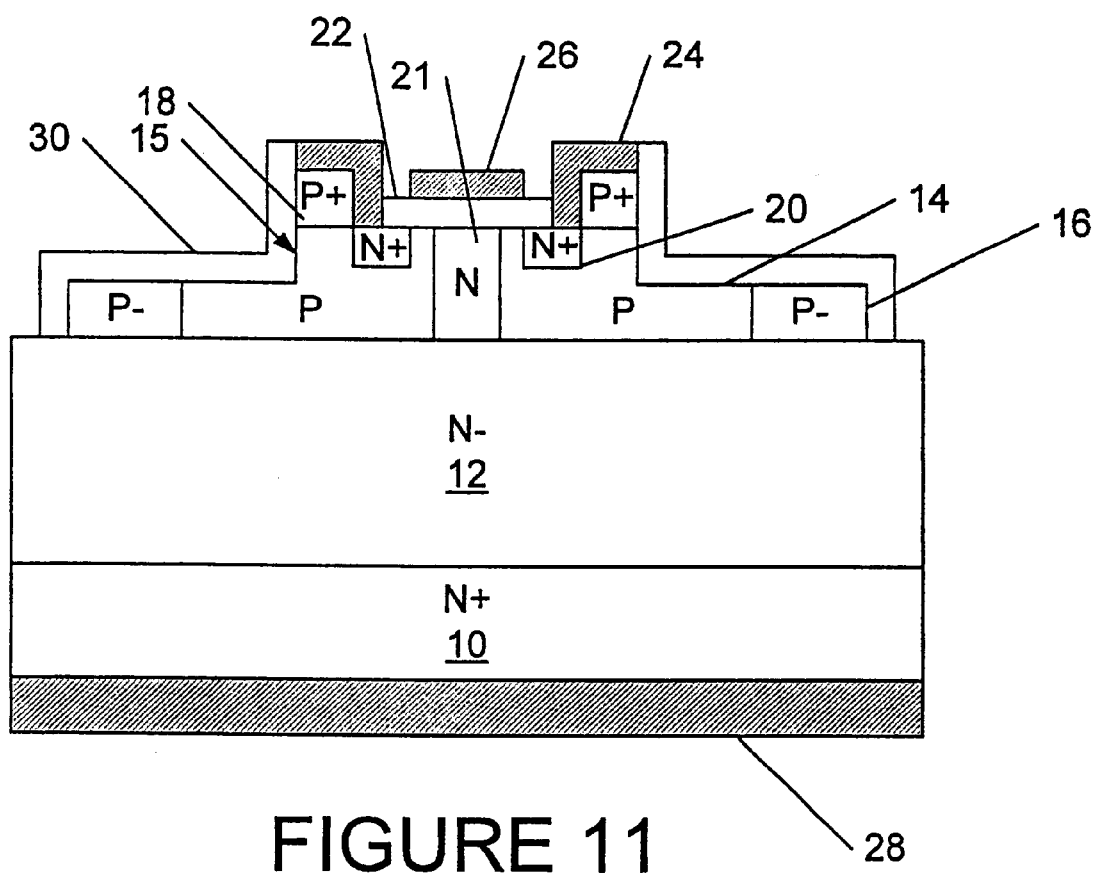

As is illustrated in FIG. 11, contact holes may be formed in the dielectric material 52' and ohmic contacts formed in the contact holes to provide source contacts 24. Similarly, an ohmic contact 28 may be formed on the substrate 10. Suitable ohmic contact materials include, but not limited to, nickel, titanium alloy, and aluminum. The deposited metal contacts may then be sintered at a high temperature ranging from about 500° C. to about 1200° C. An overlayer metal may also be deposited on the contacts, for example, to facilitate connection to the device.

It will be understood by those having skill in the art that the order of steps in FIGS. 1–7A and 7B–11 may be changed. Thus, for example, the channel region 21 or 21' of FIG. 7A or 7B may be formed before forming the n⁺ regions 20 of FIG. 6. Similarly, the p⁻ regions 16 may be formed either before or after formation of the n⁺ regions 20 or channel region 21 or 21'. Similarly, the contacts 24 may be formed by, for example, depositing and patterning a metal layer, and then the dielectric layer 30 provided and openings in the dielectric layer formed to the contacts 18. Accordingly, the present invention should not be construed as limited to the exact sequence of operations described herein but is intended to encompass other sequences of fabrication which will become apparent to those of skill in the art in light of the present disclosure.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A unit cell of a vertical silicon carbide power device, comprising:
    a first p-type silicon carbide epitaxial layer on an n-type silicon carbide substrate;
    at least one first region of n-type silicon carbide which extends through the first p-type silicon carbide epitaxial layer to the n-type silicon carbide substrate;
    at least one second region of n-type silicon carbide which is adjacent and spaced apart from the first region of n-type silicon carbide; and
    a gate dielectric over the first region of n-type silicon carbide in the first p-type silicon carbide layer and at least a portion of the second region of n-type silicon carbide.

2. A unit cell according to claim 1, further comprising:
    a gate contact on the gate dielectric;
    a first contact so as to contact a portion of the p-type epitaxial layer and the second region of n-type silicon carbide; and
    a second contact on the substrate.

3. A unit cell according to claim 1, wherein the first and second regions of n-type silicon carbide are regions of the first p-type epitaxial layer with implanted n-type dopants.

4. A unit cell according to claim 3, further comprising a trench in the first p-type epitaxial layer and wherein the channel region comprise a region of n-type silicon carbide adjacent sidewalls of the trench.

5. A unit cell according to claim 2, further comprising:
    at least one p-type contact region of epitaxial p-type silicon carbide on the first p-type epitaxial layer, wherein the at least one p-type contact region has a carrier concentration higher than the first p-type silicon carbide epitaxial layer so as to provide a at least one p+ contact region, wherein the at least one p+ contact region is adjacent the at least one second n-type region and wherein the at least one second n-type region is between the at least one p+ contact region and the at least one first n-type region.

6. A unit cell according to claim 5, wherein the first contact contacts the at least one p+ contact region and the at least one second region of n-type silicon carbide.

7. A unit cell according to claim 5, wherein the first p-type epitaxial layer forms at least one step having a sidewall which extends into the first p-type silicon carbide epitaxial layer and wherein the sidewall of the at least one step is spaced apart from the at least one second n-type region and is formed opposite the at least one first n-type region.

8. A unit cell according to claim 7, wherein the first p-type epitaxial forms a plurality of steps spaced apart from the at least one second n-type region and is formed opposite the at least one first n-type region.

9. A unit cell according to claim 7, further a compensation region of n-type dopants in the at least one step to compensate p-type dopants in the first p-type epitaxial layer.

10. A unit cell according to claim 9, wherein the compensation region is a distance from the sidewall of the step which corresponds to a desired breakdown voltage of the power device.

11. A unit cell according to claim 9, further comprising a passivating layer formed on exposed portions of the p+ contact regions and the first p-type epitaxial layer.

12. A unit cell according to claim 11, further comprising an n-type epitaxial layer between the first p-type silicon carbide epitaxial layer and the substrate.

* * * * *

UNITED STATES PATENT AND TRADEMARK OFFICE
CERTIFICATE OF CORRECTION

PATENT NO. : 6,653,659 B2
DATED : November 25, 2003
INVENTOR(S) : Ryu et al.

It is certified that error appears in the above-identified patent and that said Letters Patent is hereby corrected as shown below:

Column 10,
Line 12, should read -- 7. A unit cell according to claim 6, wherein the first p-type --
Line 32, should read -- 12. A unit cell according to claim 1, further comprising --

Signed and Sealed this

Fourth Day of May, 2004

JON W. DUDAS
*Acting Director of the United States Patent and Trademark Office*